US008502605B2

(12) United States Patent
Fukushima

(10) Patent No.: US 8,502,605 B2
(45) Date of Patent: Aug. 6, 2013

(54) ACOUSTIC PSEUDO-TRIODE CHARACTERISTIC AMPLIFICATION DEVICE AND ACOUSTIC PSEUDO-TRIODE CHARACTERISTIC PUSH-PULL AMPLIFICATION DEVICE

(76) Inventor: Akira Fukushima, Oume (JP)

(*) Notice: Subject to any disclaimer, the term of this patent is extended or adjusted under 35 U.S.C. 154(b) by 5 days.

(21) Appl. No.: 13/267,321

(22) Filed: Oct. 6, 2011

(65) Prior Publication Data
US 2012/0092070 A1    Apr. 19, 2012

(30) Foreign Application Priority Data

Oct. 14, 2010 (JP) .................................. 2010-231517

(51) Int. Cl.
*H03F 3/26* (2006.01)

(52) U.S. Cl.
USPC ........................................................ 330/267

(58) Field of Classification Search
USPC ................... 330/263, 264, 265, 267, 268
See application file for complete search history.

(56) References Cited

U.S. PATENT DOCUMENTS

| | | | | |
|---|---|---|---|---|
| 4,334,197 | A * | 6/1982 | Otao | ............................. 330/268 |
| 5,448,190 | A | 9/1995 | Etoh | |
| 6,268,771 | B1 | 7/2001 | Miyazaki | |

FOREIGN PATENT DOCUMENTS

| | | |
|---|---|---|
| JP | 50-60169 | 5/1975 |
| JP | 54-51359 A | 4/1979 |
| JP | 6-276037 A | 9/1994 |
| JP | 6-283944 A | 10/1994 |
| JP | 2000-349568 A | 12/2000 |
| JP | 2008-131630 A | 6/2008 |

OTHER PUBLICATIONS

Notice of Grounds for Rejection for Japanese Patent Application No. 2010-231517 drafted Nov. 30, 2010 with English translation.

* cited by examiner

*Primary Examiner* — Steven J Mottola
(74) *Attorney, Agent, or Firm* — Cantor Colburn LLP

(57) ABSTRACT

An input terminal is connected to a positive-phase terminal of a differential amplification circuit. A negative-phase terminal of the differential amplification circuit is connected to an emitter electrode of a transistor, and an output terminal thereof is connected to a base electrode of the transistor. An input side resistor is connected between a collector electrode of the transistor and the input terminal, and a secondary input side resistor is connected between the input terminal and a ground conductor. An output side resistor is connected between the emitter electrode of the transistor and the ground conductor. The collector electrode of the transistor is connected to a load terminal.

7 Claims, 8 Drawing Sheets

ACOUSTIC PSEUDO-TRIODE CHARACTERISTIC AMPLIFICATION DEVICE AND ACOUSTIC PSEUDO-TRIODE CHARACTERISTIC PUSH-PULL AMPLIFICATION DEVICE

CROSS-REFERENCE TO RELATED APPLICATIONS

The present application contains subject matter related to that disclosed in Japanese Priority Patent Application JP 2010-231517 filed in the Japan Patent Office on Oct. 14, 2010, the entire contents of which are hereby incorporated by reference.

BACKGROUND OF THE INVENTION

1. Field of the Invention

The present invention relates to an acoustic amplification device, and more particularly to improvement in characteristics of an acoustic amplification device using a semiconductor element.

2. Background Art

There has come into wide use an audio amplifier which amplifies an acoustic signal output from a sound source device such as a tuner, a CD player, or a portable media player, and drives a speaker. In the related art, an amplifier using a triode has been used as an amplifier that generates natural sound. However, a vacuum tube such as the triode has a problem in that the life is short, and thus an audio amplifier using a semiconductor element such as a bipolar transistor or a field effect transistor has superseded the vacuum audio amplifier. In many cases, the audio amplifier using the semiconductor element is provided with a negative feedback path between a final stage circuit and an initial stage circuit in order to stabilize a bias voltage, reduce distortion components included in an output signal, and the like.

In addition, JP 6-276037A discloses an audio power-amplifier provided with a negative feedback path between a final stage circuit and an initial stage circuit. In addition, JP 2000-349568A discloses an amplification device using a MOSFET which is operated in a triode region. Here, the triode region refers to a region where a relationship between a drain current and a drain-source voltage closely approximates a relationship between a plate current and a plate-cathode voltage in the triode.

SUMMARY OF THE INVENTION

In the audio amplifier provided with the negative feedback path, if a load can be regarded as a resistor having a linear characteristic, there is a characteristic improvement effect using the negative feedback path. However, typically, the load is a speaker having a nonlinear characteristic. At this time, there are cases where the negative feedback path does not necessarily contribute to improving characteristics of an output signal driving the speaker, and unnatural sound is generated from the speaker.

It is desirable to enable a characteristic of an acoustic amplification device using a semiconductor element to closely approximate a characteristic of a triode amplifier, and to reduce distortion components of an output signal supplied to a load. According to an embodiment of the invention, there is provided an acoustic pseudo-triode characteristic push-pull amplification device including first and second current driving sources that respectively output signals responding to a common input signal, and have complementary electric characteristics with each other; a first pseudo-triode characteristic amplification unit that receives a signal from the first current driving source; and a second pseudo-triode characteristic amplification unit that receives a signal from the second current driving source and has a complementary electric characteristic with an electric characteristic of the first pseudo-triode characteristic amplification unit, wherein each of the first and second pseudo-triode characteristic amplification units includes a semiconductor element that has a first electrode, a second electrode, and a control electrode, where a current flowing between the first electrode and the second electrode varies depending on a signal applied to the control electrode; an input terminal that leads an applied signal to the control electrode; an acoustic load terminal that is provided in a path drawn from the first electrode and is connected to an acoustic load which is interposed between the acoustic load terminal and a ground conductor; a second electrode side resistor that is provided between the second electrode and a reference voltage terminal; and an input side resistor that is provided between the first electrode and the input terminal, wherein DC voltages having different polarities are respectively applied between the reference voltage terminal of the first pseudo-triode characteristic amplification unit and the ground conductor, and between the reference voltage terminal of the second pseudo-triode characteristic amplification unit and the ground conductor, wherein the acoustic load terminal of the first pseudo-triode characteristic amplification unit and the acoustic load terminal of the second pseudo-triode characteristic amplification unit are connected in common, and a common acoustic load is connected to the first and second pseudo-triode characteristic amplification units, wherein the first current driving source has a current-driving semiconductor element that allows a current varying depending on the input signal to flow through the corresponding input terminal with signal source impedance greater than input impedance of the input terminal, and wherein the second current driving source has a current driving semiconductor element that allows a current varying depending on the input signal to flow through the corresponding input terminal with signal source impedance greater than input impedance of the input terminal of the second pseudo-triode characteristic amplification unit.

In the embodiment of the invention, a bipolar transistor, an FET (Field Effect Transistor), or the like may be used as the semiconductor element. If the bipolar transistor is used, the first electrode, the second electrode, and the control electrode respectively correspond to a collector electrode, an emitter electrode, and a base electrode. In addition, if the FET is used, the first electrode, the second electrode, and the control electrode respectively correspond to a drain electrode, a source electrode, and a gate electrode. As the semiconductor element, there may be used a regulator element which has a first electrode, a second electrode, and a control electrode, where a current flowing between the first electrode and the second electrode varies depending on a signal applied to the control electrode.

The acoustic pseudo-triode characteristic push-pull amplification device preferably further includes a current mirror circuit that is connected to the input terminal of the second pseudo-triode characteristic amplification unit; and a bias-stabilizing circuit that is connected to a connection path of the second electrode and the second electrode side resistor of the second pseudo-triode characteristic amplification unit and the current mirror circuit, and allows a current according to a potential at the connection path and a reference potential to flow through the current mirror circuit. At this time, the current mirror circuit may allow a current according to a current flowing from the bias-stabilizing circuit to flow through a path which is formed from the input terminal of the second pseudo-triode characteristic amplification unit to the current mirror circuit.

In addition, the acoustic pseudo-triode characteristic push-pull amplification device preferably further includes a drift-stabilizing circuit that is connected to the input terminal of the first pseudo-triode characteristic amplification unit and the acoustic load terminal. At this time, the drift-stabilizing circuit may allow a current varying according to a potential at the acoustic load terminal and a ground potential to flow through a path which is formed from the input terminal of the first pseudo-triode characteristic amplification unit to the drift-stabilizing circuit.

Each of the first and second pseudo-triode characteristic amplification units preferably includes a voltage-holding circuit that maintains a relationship between a voltage at the input terminal and a voltage at the second electrode to be constant, and outputs to the control electrode a voltage according to the voltage at the input terminal. In this case, the voltage-holding circuit is preferably a differential amplification circuit which has a first terminal connected to the input terminal, a second terminal connected to the second electrode, and a third terminal connected to the control electrode, has the first and second terminals as a pair of differential input terminals, and has the third terminal as an output terminal.

Further, each of the first and second pseudo-triode characteristic amplification units preferably includes a secondary input side resistor that is provided between the input terminal and the reference voltage terminal.

According to another embodiment of the invention, there is provided an acoustic pseudo-triode characteristic amplification device including a semiconductor element that has a first electrode, a second electrode, and a control electrode, where a current flowing between the first electrode and the second electrode varies depending on a signal applied to the control electrode; an input terminal that leads to the control electrode a signal applied from a current driving source; an acoustic load terminal that is provided in a path drawn from the first electrode and is connected to an acoustic load which is interposed between the acoustic load terminal and the other end of a DC voltage source of which one end is connected to a ground conductor; a second electrode side resistor that is provided between the second electrode and the ground conductor; an input side resistor that is provided between the first electrode and the input terminal; and a voltage-holding circuit that maintains a relationship between a voltage at the input terminal and a voltage at the second electrode to be constant, and outputs to the control electrode a voltage varying according to the voltage at the input terminal, wherein the current-driving source allows a current to flow through the input terminal as an acoustic signal with signal source impedance greater than input impedance of the input terminal, and wherein the voltage-holding circuit is a differential amplification circuit which has a first terminal connected to the input terminal, a second terminal connected to the second electrode, and a third terminal connected to the control electrode, has the first and second terminals as a pair of differential input terminals, and has the third terminal as an output terminal.

The acoustic pseudo-triode characteristic amplification device preferably further includes a secondary input side resistor that is provided between the input terminal and the reference voltage terminal.

According to the embodiments of the invention, it is possible to enable a characteristic of an acoustic amplification device using a semiconductor element to closely approximate a characteristic of a triode amplifier, and to reduce distortion components of an output signal supplied to a load.

DETAILED DESCRIPTION OF THE INVENTION

Figure 1:
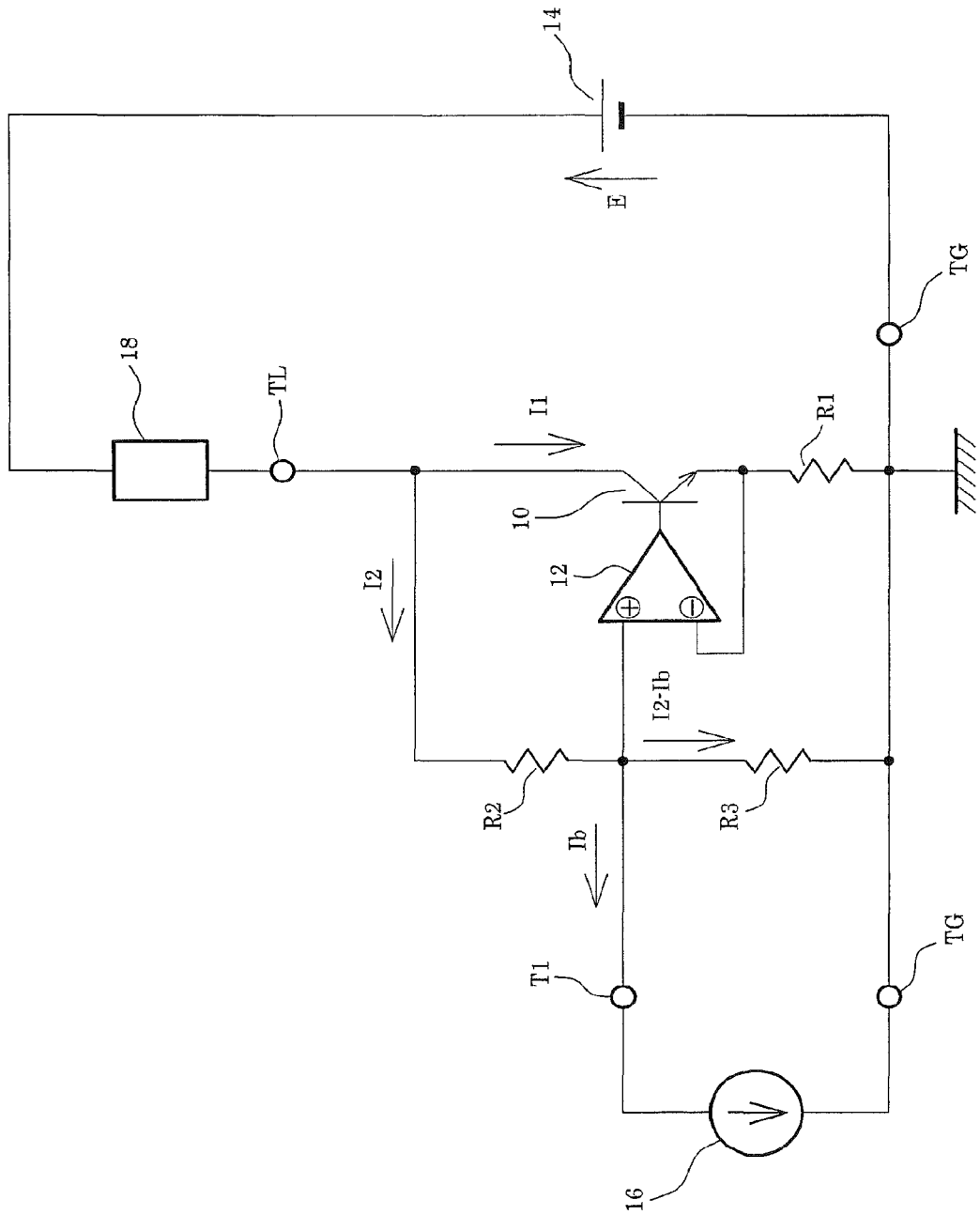
FIG. 1 is a diagram illustrating a configuration of a pseudo-triode characteristic linear amplifier according to a first embodiment.

FIG. 1 shows a configuration of a pseudo-triode characteristic linear amplifier according to a first embodiment. The pseudo-triode characteristic linear amplifier uses a semiconductor element, has a characteristic closely approximating a characteristic of the triode amplifier, and reduces distortion of an output signal. The semiconductor element uses an element which has three electrodes; that is, a first electrode, a second electrode, and a control electrode, where a current flowing between the first and second electrodes varies depending on a signal applied to the control electrode. Here, a circuit configuration using a bipolar transistor as the semiconductor element will be described. In the following description, the bipolar transistor is simply referred to as a transistor.

An input terminal T1 of the pseudo-triode characteristic linear amplifier is connected to a positive-phase terminal of a differential amplification circuit 12. In addition, a negative-phase terminal of the differential amplification circuit 12 is connected to an emitter electrode of a transistor 10, and an output terminal of the differential amplification circuit 12 is connected to a base electrode of the transistor 10. An input side resistor R2 is connected between a collector electrode of the transistor 10 and the input terminal T1, and a secondary input side resistor R3 is connected between the input terminal T1 and a ground conductor. An output side resistor R1 is connected between the emitter electrode of the transistor 10 and the ground conductor. In addition, a load terminal TL is connected to the collector electrode of the transistor 10. Instead of the differential amplification circuit 12, there may be used a general circuit (voltage-holding circuit) which maintains a voltage between the input terminal T1 and the emitter electrode to be constant and outputs a voltage according to a voltage at the input terminal T1 to the base electrode.

A current-driving source 16 is connected between the input terminal T1 and a ground terminal TG. The current-driving source 16 is a signal current source which has signal source impedance much greater than input impedance of the pseudo-triode characteristic linear amplifier, where the magnitude of a signal current input to the pseudo-triode characteristic linear amplifier is not greatly dependent on the input impedance.

An acoustic load 18 and a DC voltage source 14 which are connected in series to each other are connected between the load terminal TL and the ground terminal TG. A positive terminal of the DC voltage source 14 is connected to the acoustic load 18, and a negative terminal thereof is connected to the ground terminal TG. The acoustic load 18 is a load which converts an electric signal into sound, such as a speaker.

Figure 2:
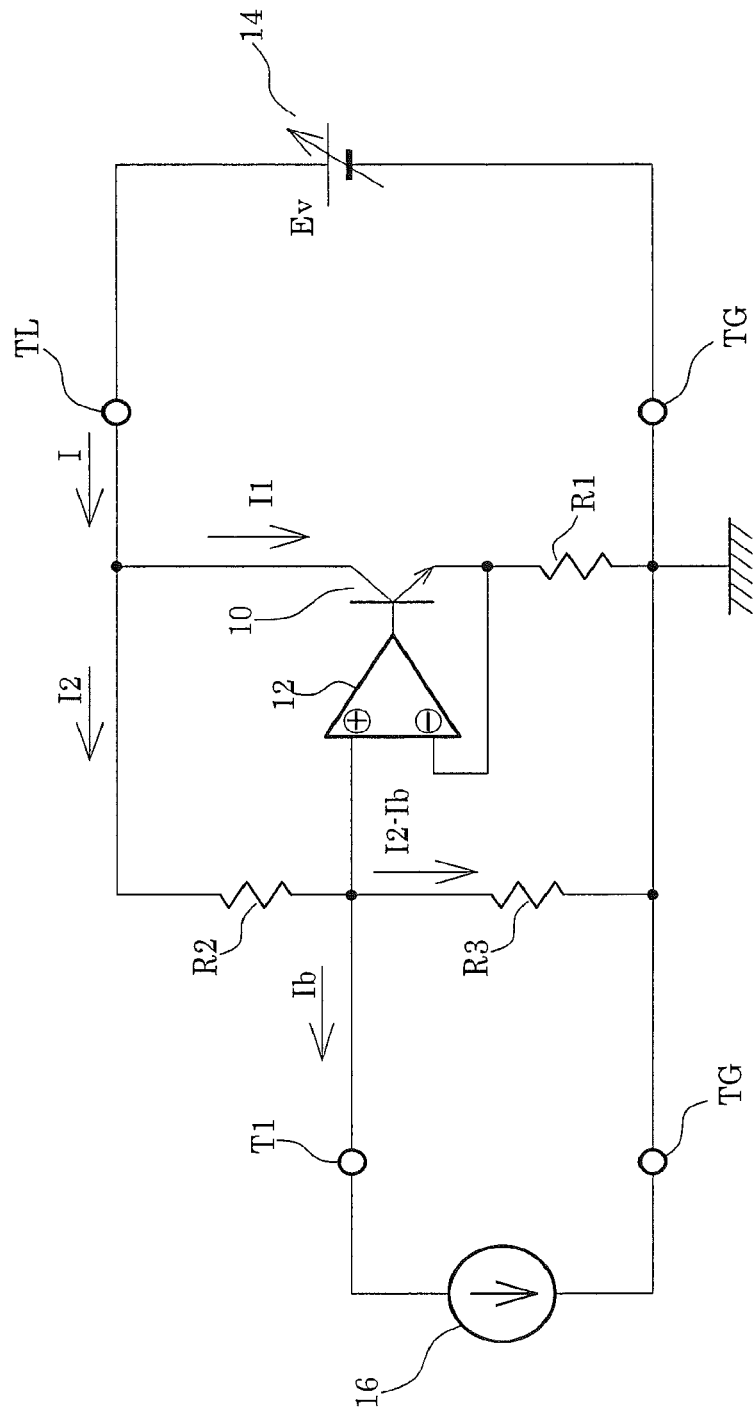
FIG. 2 is a diagram illustrating a configuration of a pseudo-triode circuit.

An operation principle of the pseudo-triode characteristic linear amplifier will be described. Here, in order to describe a relationship between a voltage and a current at the load terminal TL, a pseudo-triode circuit shown in FIG. 2 where the acoustic load 18 is short-circuited is analyzed. If a current flowing into the collector electrode is denoted by I1, a current flowing through the input side resistor R2 in the direction from the collector electrode to the input terminal T1 is denoted by I2, a current flowing from the input terminal T1 to the current driving source 16 is denoted by Ib, a current flowing from the positive terminal of the DC voltage source 14 to the load terminal TL is denoted by I, and a voltage at the load terminal TL is denoted by Ey, the following circuit equation (Equation 1) is established. However, it is assumed that a base current of the transistor 10 is much smaller than a collector current, and thus voltages at the positive-phase terminal and the negative-phase terminal of the differential amplification circuit 12 are equal to each other.

$$\begin{cases} R2 \cdot I2 + R3(I2 - Ib) = Ev \\ R1 \cdot I1 - R3(I2 - Ib) = 0 \\ I1 + I2 - I = 0 \end{cases} \quad \text{[Equation 1]}$$

By solving the circuit equation, the following Equation (Equation 2) can be obtained as an equation indicating a relationship between the load terminal current I which flows from the positive terminal of the DC voltage source 14 to the load terminal TL and the driving source current Ib which flows from the input terminal T1 to the current driving source 16.

$$I = \frac{R1 + R3}{R1(R2 + R3)} Ev - \frac{R3(R2 - R1)}{R1(R2 + R3)} Ib \quad \text{[Equation 2]}$$

Figure 3:
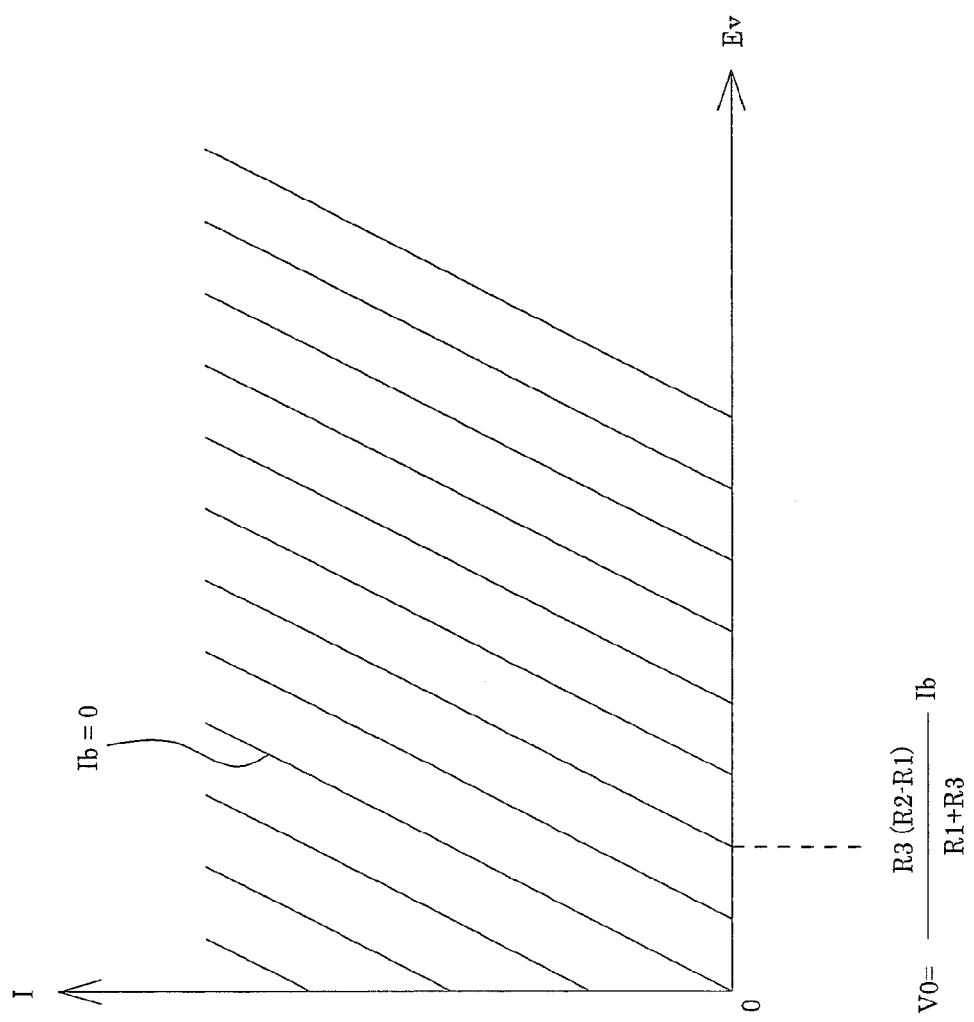
FIG. 3 is a diagram illustrating a relationship between a load terminal current and a load terminal voltage.

Here, FIG. 3 shows a relationship between the load terminal current I and the load terminal voltage Ev when the driving source current Ib is used as a parameter. In FIG. 3, the horizontal axis expresses the load terminal voltage Ev, and the vertical axis expresses the load terminal current I. When the driving source current Ib is constant, the load terminal current I varies linearly depending on the variation in the load terminal voltage Ev. The output characteristic line is a straight line which passes through the point (V0, 0) on the horizontal axis, and has the coefficient (R1+R3)/R1/(R2+R3) which is multiplied by Ev of the first term of the right side in Equation 2, as a slope. Here, V0=R3(R2−R1)Ib/(R1+R3).

If the driving source current Ib, which is a parameter, varies, the output characteristic line moves horizontally in the transverse axis direction. An amount of movement thereof is determined based on the second term of the right side in Equation 2. That is to say, if the driving source current Ib varies by Δ, the intercept of the output characteristic line varies by −R3(R2−R1)Δ/R1/(R2+R3), and the output characteristic line moves horizontally by R3 (R2−R1)Δ/(R1+R3) in the horizontal axis direction.

As such, the reason why the load terminal current I varies linearly depending on the variation in the load terminal voltage Ev and why the output characteristic line moves horizontally at a constant ratio depending on the variation in the driving source current Ib is that the voltage between the base electrode and the emitter electrode of the transistor 10 is maintained constant by the differential amplification circuit 12.

If the driving source current Ib is made to correspond to a voltage at the grid of the triode, the relationship between the load terminal current I and the load terminal voltage Ev comes to closely approximate a relationship obtained by making linear a relationship between a plate current and a plate voltage in the triode. Therefore, it is possible to form an amplifier having a characteristic closely approximating the characteristic of the triode amplifier by using the pseudo-triode circuit shown in FIG. 2.

Figure 4:
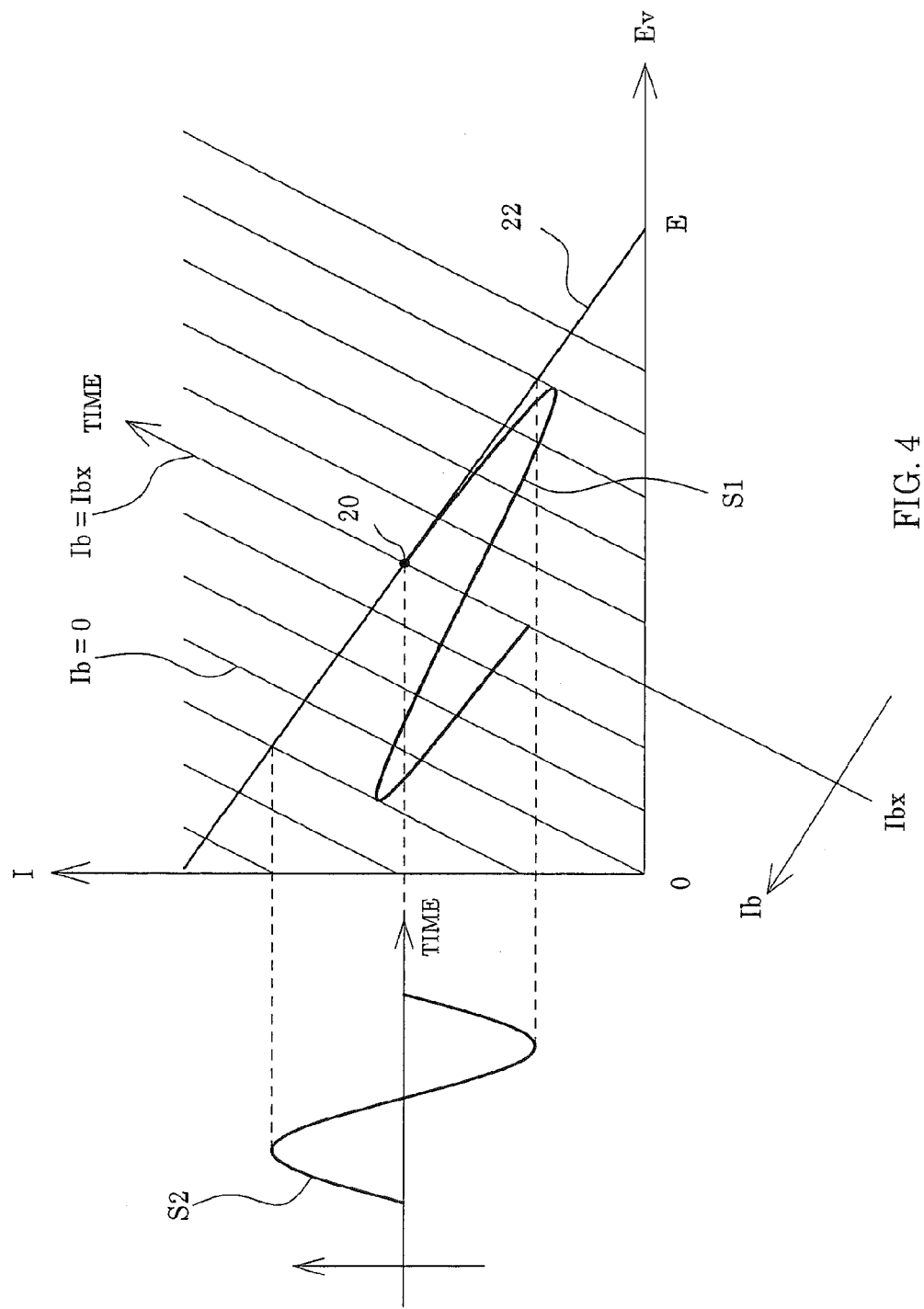
FIG. 4 is a diagram illustrating a load characteristic of the pseudo-triode characteristic linear amplifier.

An operation of the pseudo-triode characteristic linear amplifier in FIG. 1 will be described. FIG. 4 shows a load characteristic of the pseudo-triode characteristic linear amplifier. The horizontal axis indicates the load terminal voltage Ev, and the vertical axis indicates the load terminal current I. An intersection point between the output characteristic line and a load line 22 is used as a driving point 20, and the load characteristic shows a state of the acoustic load 18 using the driving point 20. A difference between the voltage coordinate value of the driving point 20 and the power supply voltage E indicates a voltage value applied to the acoustic load 18, and the voltage coordinate value of the driving point 20 indicates a value of a voltage between the collector electrode of the transistor 10 and the ground conductor. A current coordinate value of the driving point 20 indicates a value of a current flowing through the acoustic load 18. If the acoustic load 18 is a resistor with a resistance value RL, the load line 22 is a straight line which passes through the point (E, 0) on the horizontal axis and has a slope of −RL.

When the driving source current Ib varies, the output characteristic line moves horizontally in the horizontal axis direction, and the driving point 20 moves on the load line 22. Therefore, a voltage applied to the acoustic load 18 and a current flowing through the acoustic load 18 vary depending on the variation in the driving source current Ib. Thereby, the voltage and the current as a result of amplification of the driving source current Ib can be applied to the acoustic load 18.

For example, in a case where the driving source current Ib includes a bias current Ibx and a signal current Ibs and is expressed as Ib=Ibx+Ibs, the driving point 20 has an intersection point between the output characteristic line at Ib=Ibx and the load line 22 as a central point, and moves on the load line 22 depending on the signal current Ibs. The waveform S1 in FIG. 4 shows a waveform of the signal current Ibs when the output characteristic line at Ib=Ibx is given as the time axis. A time waveform of the signal current flowing through the acoustic load 18 is a waveform obtained by projecting a locus of the driving point 20 moving on the load line 22 depending on the signal current Ibs onto the vertical axis, as shown in the waveform S2 in the left part of FIG. 4.

According to the pseudo-triode characteristic linear amplifier in the embodiment, the relationship between the load terminal current I and the load terminal voltage Ev can be made to closely approximate the relationship between the plate current and the plate voltage of the triode. Thereby, it is possible to form an amplifier having the same acoustic characteristic as the triode amplifier, using a semiconductor element. In addition, according to the pseudo-triode characteristic linear amplifier in the embodiment, the relationship between the load terminal current I and the load terminal voltage Ev is linearized, and thus the output characteristic line moves horizontally at a constant ratio depending on the variation in the driving source current Ib. Therefore, it is possible to reduce distortion of an output signal supplied to the acoustic load 18.

Figure 5:
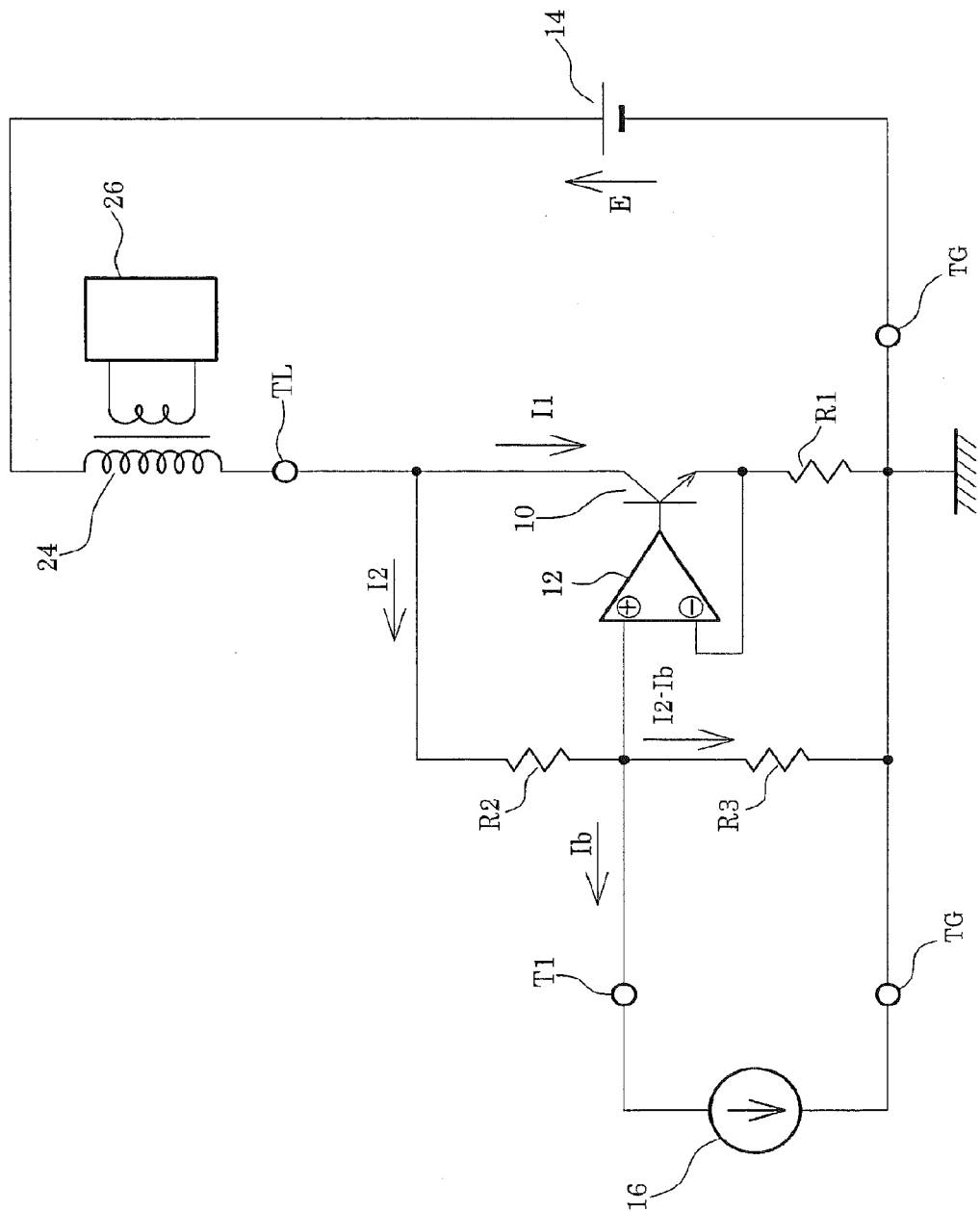
FIG. 5 is a diagram illustrating a detailed configuration example of the pseudo-triode characteristic linear amplifier.

FIG. 5 shows a detailed configuration example of the pseudo-triode characteristic linear amplifier. The amplifier is a single amplifier having a matching transformer 24 and a speaker 26 as the acoustic load 18. A bias voltage and a bias current of the transistor 10 are set such that the pseudo-triode characteristic linear amplifier is operated as a class A amplifier. An output impedance when the amplifier side is viewed from the load terminal TL is greater than impedance of the speaker 26. Therefore, in this detailed example, the matching transformer 24 is used to match the output impedance with the impedance of the speaker 26. A primary winding of the matching transformer 24 is connected between the load terminal TL and the positive terminal of the DC voltage source 14. The speaker 26 is connected between the two ends of a secondary winding of the matching transformer 24.

In addition, the pseudo-triode characteristic linear amplifier according to the embodiment may have a configuration in which the secondary input side resistor R3 is removed and this part is open. In this case, the relationship between the load terminal current I and the driving source current Ib is given as the following Equation 3. Equation 3 is obtained when R3 in Equation 2 is infinite.

$$I = \frac{1}{R1} Ev - \frac{R2 - R1}{R1} Ib \qquad \text{[Equation 3]}$$

In addition, quality of sound generated from the speaker 26 depends on a slope of the output characteristic line, a horizontal movement amount of the output characteristic line depending on the variation in the driving source current Ib, and the like. As clear from Equation 2, the values can be adjusted by varying the resistance values of the output side resistor R1, the input side resistor R2, and the secondary input side resistor R3. Therefore, resistance values of the output side resistor R1, the input side resistor R2, and the secondary input side resistor R3 are preferably adjusted such that sound generated from the speaker 26 is optimized.

As the semiconductor element, an FET (Field Effect Transistor) may be used instead of the transistor. In this case, a gate electrode, a drain electrode, and a source electrode of the FET are respectively connected to the parts to which the base electrode, the collector electrode, and the emitter electrode of the transistor are connected.

Figure 6:
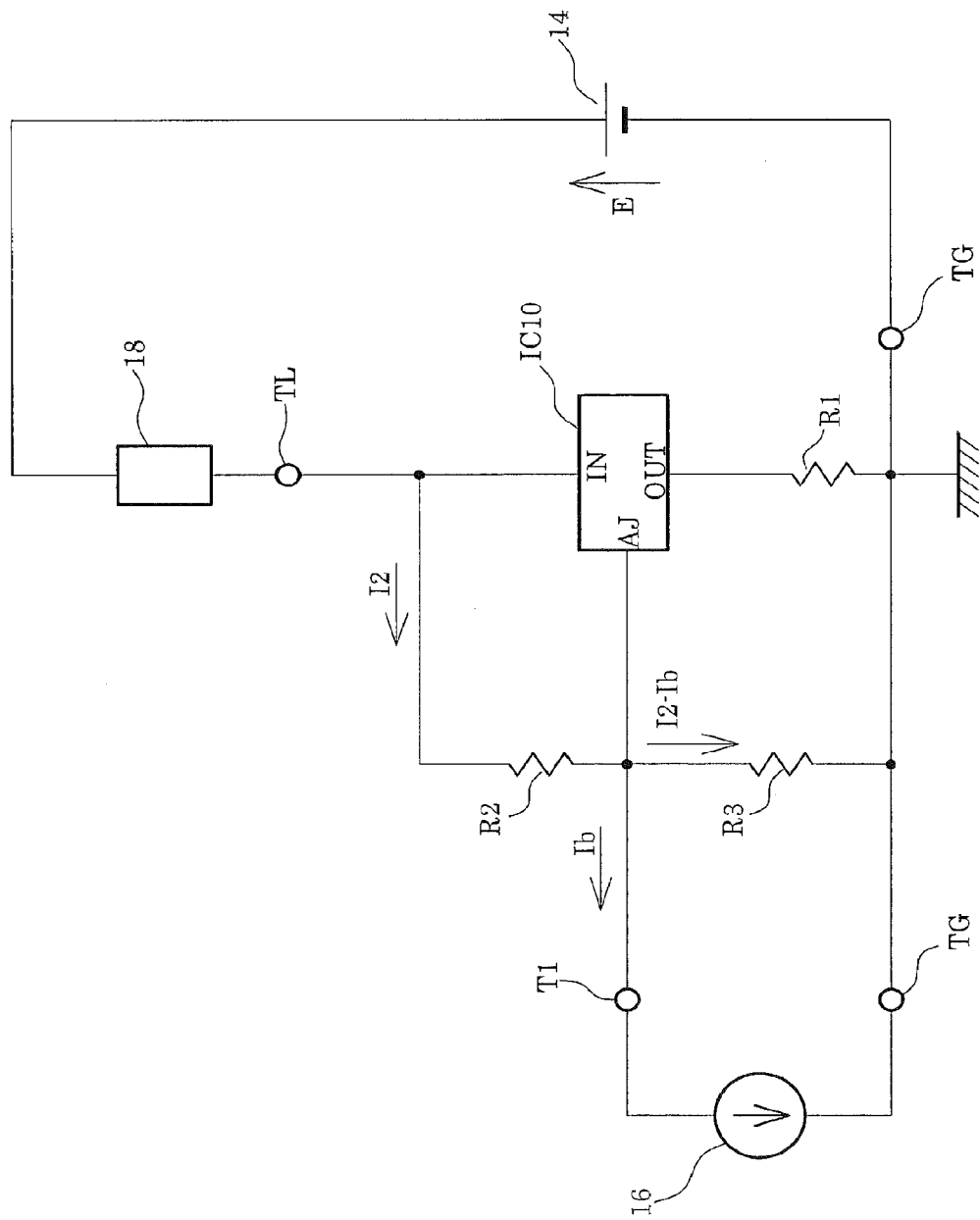
FIG. 6 is a diagram illustrating a configuration of a pseudo-triode characteristic linear amplifier using a regulator element.

In the pseudo-triode characteristic linear amplifier according to the embodiment, a regulator element IC10 may be used as shown in FIG. 6. As the regulator element IC10, for example, "LM317" provided by National Semiconductor Corporation may be used. An IN terminal, an OUT terminal, and an AJ terminal respectively correspond to the first electrode, the second electrode, and the control electrode. The IN terminal is connected to the load terminal TL, and the OUT terminal is connected to the one end of the output side resistor R1. In addition, the AJ terminal is connected to the connection point between the input side resistor R2 and the secondary input side resistor R3. Since, in the regulator element IC10, a voltage at the IN terminal has a linear relationship with a current which flows into the IN terminal and out of the OUT terminal, it is possible to achieve an effect of reducing distortion components of an output signal supplied to a load even if the differential amplification circuit 12 shown in FIG. 1 is not provided.

With such a configuration as well, the relationship between the load terminal current I and the load terminal voltage Ev comes to closely approximate the relationship between the plate current and the plate voltage of the triode. Further, the relationship between the load terminal current I and the load terminal voltage Ev is linearized, and thus the output characteristic line moves horizontally at a constant ratio depending on the variation in the driving source current Ib. Thereby, it is possible to enable an acoustic characteristic to closely approximate the characteristic of the triode amplifier and to reduce distortion of an output signal.

Figure 7:
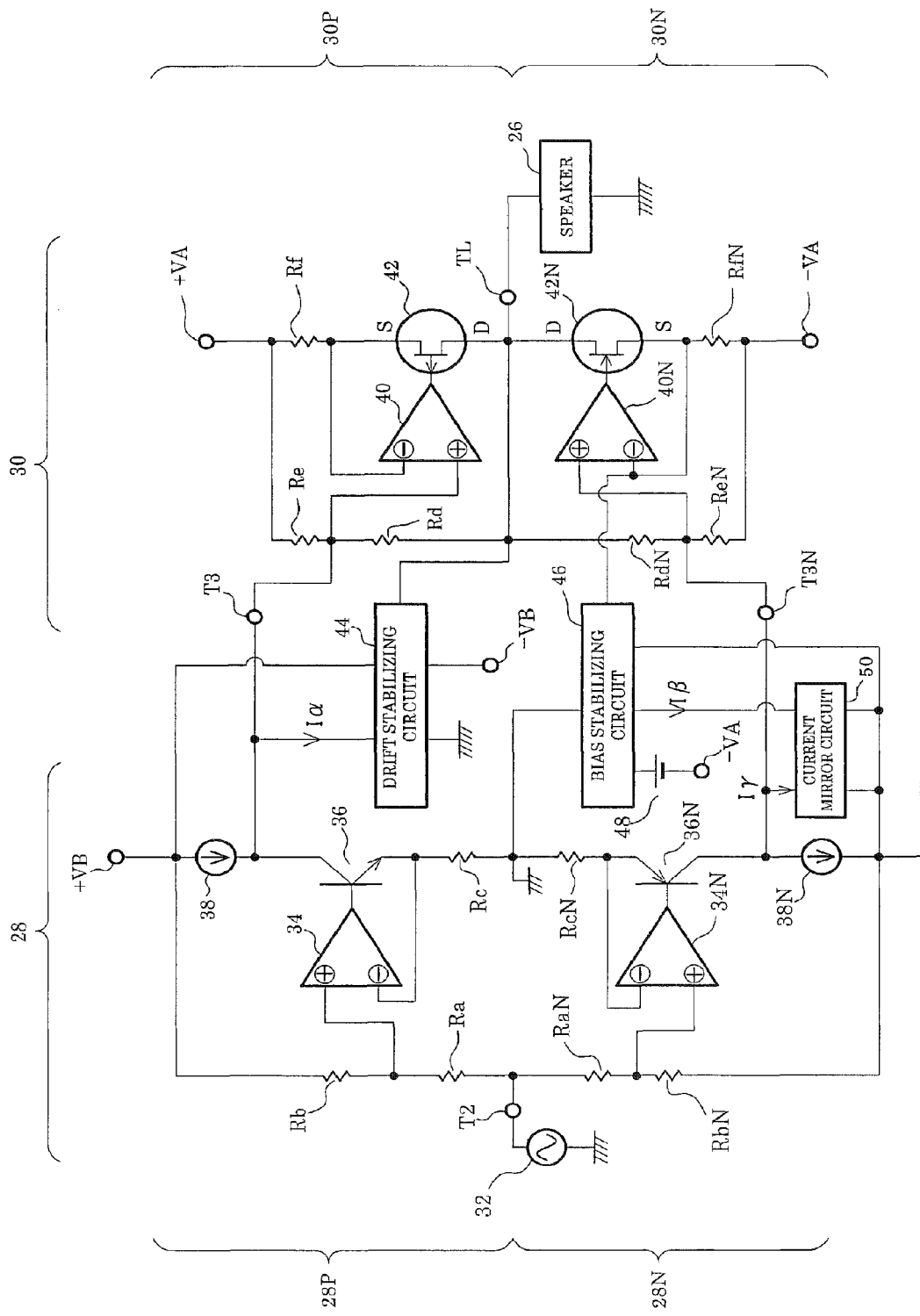
FIG. 7 is a diagram illustrating a pseudo-triode characteristic OTL push-pull linear amplifier according to a second embodiment.

FIG. 7 shows a configuration of a pseudo-triode characteristic OTL push-pull linear amplifier according to a second embodiment. The amplifier is an OTL (Output Transformer Less) push-pull circuit which is formed by using a pair of circuits having a complementary characteristic in a driving unit 28 and a power amplification unit 30 respectively. The driving unit 28 is applied with a positive DC voltage +VB and a negative DC voltage −VB as a power supply voltage, and the power amplification unit 30 is applied with a positive DC voltage +VA and a negative DC voltage −VA as a power supply voltage.

The driving unit 28 functions as a current-driving source of the power amplification unit 30. A circuit configuration of a positive power supply driving portion 28P of the driving unit 28, which is driven by the positive DC voltage +VB, will be described. One end of a resistor Ra is connected to an input terminal T2. The other end of the resistor Ra is connected to a positive-phase terminal of a differential amplification circuit 34. A resistor Rb is connected between the positive power supply terminal +VB and the positive-phase terminal of the differential amplification circuit 34. A negative-phase terminal of the differential amplification circuit 34 is connected to an emitter electrode of an NPN type transistor 36, and an output terminal of the differential amplification circuit 34 is connected to a base electrode of the NPN type transistor 36. A resistor Rc is connected between an emitter electrode of the NPN type transistor 36 and a ground conductor, and a DC constant current source 38 is connected between the positive power supply terminal +VB and a collector electrode of the NPN type transistor 36. The collector electrode of the NPN type transistor 36 is connected to a positive input terminal T3 of the power amplification unit 30.

The DC constant current source 38 supplies a bias current to the NPN type transistor 36 and the power amplification unit 30. The DC constant current source 38 has impedance which is large enough for to a signal component of a current flowing through the collector electrode of the NPN type transistor 36, and the signal component included in the collector current of the NPN type transistor 36 flows toward the positive input terminal T3 of the power amplification unit 30.

A negative power supply driving portion 28N of the driving unit 28, which is driven by the negative DC voltage −VB, shares the ground conductor with the positive power supply driving portion 28P, and has polarities of a bias voltage and a bias current reverse to the polarities of the bias voltage and the bias current of the positive power supply driving portion 28P. The positive power supply driving portion 28P uses the NPN type transistor 36, whereas the negative power supply driving portion 28N uses a PNP type transistor 36N. The devices included in the negative power supply driving portion 28N have "N" at the end of the reference numerals added to the devices having the complementary relationship, included in the positive power supply driving portion 28P.

One end of a resistor RaN is connected to an input terminal T2. The other end of the resistor RaN is connected to a positive-phase terminal of a differential amplification circuit 34N. A resistor RbN is connected between the negative power supply terminal −VB and the positive-phase terminal of the differential amplification circuit 34N. A negative-phase terminal of the differential amplification circuit 34N is connected to an emitter electrode of a PNP type transistor 36N, and an output terminal of the differential amplification circuit 34N is connected to a base electrode of the PNP type transistor 36N. A resistor RcN is connected between an emitter electrode of the PNP type transistor 36N and the ground conductor, and a DC constant current source 38N is connected between the negative power supply terminal −VB and a collector electrode of the PNP type transistor 36N. The collector electrode of the PNP type transistor 36N is connected to a negative input terminal T3N of the power amplification unit 30.

The DC constant current source 38N supplies a bias current to the PNP type transistor 36N and the power amplification unit 30. The DC constant current source 38N has impedance which is large enough for to a signal component of a current flowing through the collector electrode of the PNP type transistor 36N, and the signal component included in the collector current of the PNP type transistor 36N flows toward the negative input terminal T3N of the power amplification unit 30.

A signal source 32 is connected between the input terminal T2 and the ground conductor. The signal source 32 corresponds to a sound source device such as a tuner, a CD player, or a portable media player. The differential amplification circuit 34 of the positive power supply driving portion 28P amplifies a signal input via the resistor Ra and outputs the amplified signal to the base electrode of the NPN type transistor 36. A current corresponding to the signal applied to the base electrode flows through a path which connects the positive input terminal T3 of the power amplification unit 30 to the collector electrode of the NPN type transistor 36. Thereby, the current corresponding to the signal output from the signal source 32 flows through the positive input terminal T3 of the power amplification unit 30.

In a similar manner, the differential amplification circuit 34N of the negative power supply driving portion 28N amplifies a signal input via the resistor RaN and outputs the amplified signal to the base electrode of the PNP type transistor 36N. A current corresponding to the signal applied to the base electrode flows through a path which connects the negative input terminal T3N of the power amplification unit 30 to the collector electrode of the PNP type transistor 36N. Thereby, the current corresponding to the signal output from the signal source 32 flows through the negative input terminal T3N of the power amplification unit 30.

As such, the driving unit 28 amplifies a signal output from the signal source 32, and allows a curre77 nt corresponding to the amplified signal to flow through the positive input terminal T3 and negative input terminal T3N of the power amplification unit 30. Thereby, the driving unit 28 functions as a current driving source of the power amplification unit 30.

In addition, the positive power supply driving portion 28P and the negative power supply driving portion 28N respectively include the differential amplification circuits 34 and 34N. Thereby, there is a reduction in distortion of the currents which are made to flow through the respective input terminals of the power amplification unit 30 by the driving unit 28, through the same operation as that of the differential amplification circuit shown in FIG. 1.

Next, the power amplification unit 30 will be described. The power amplification unit 30 includes a positive power supply amplification portion 302 driven by the positive DC voltage +VA and a negative power supply amplification portion 30N driven by the negative DC voltage −VA.

A circuit configuration of the positive power supply amplification portion 30P will be described. The positive input terminal T3 is connected to a positive-phase terminal of a differential amplification circuit 40. In addition, a negative-phase terminal of the differential amplification circuit 40 is connected to a source electrode S of a P channel FET 42, and an output terminal of the differential amplification circuit 40 is connected to a gate terminal of the P channel FET 42. An input side resistor Rd is connected between a drain electrode D of the P channel FET 42 and the positive input terminal T3, and a secondary input side resistor Re is connected between the positive input terminal T3 and the positive power supply terminal +VA. In addition, an output side resistor Rf is connected between the source electrode S of the P channel FET 42 and the positive power supply terminal +VA. The drain electrode D of the P channel FET 42 is connected to the load terminal TL. In addition, instead of the differential amplification circuit 40, there may be used a general circuit which maintains constant a voltage between the positive input terminal T3 and the source electrode S and outputs a voltage based on the voltage at the positive input terminal T3 to the gate electrode. The speaker 26 is connected between the load terminal TL and the ground conductor as an acoustic load.

The negative power supply amplification portion 30N shares the ground conductor with the positive power supply amplification portion 30P, and has polarities of a bias voltage and a bias current reverse to the polarities of the bias voltage and the bias current of the positive power supply amplification portion 30P. The positive power supply amplification portion 30P uses the P channel FET 42, whereas the negative power supply amplification portion 30N uses an N channel FET 42N. The devices included in the negative power supply amplification portion 30N have "N" at the end of the reference numerals added to the devices having the complementary relationship, included in the positive power supply amplification portion 30P.

The negative input terminal T3N is connected to a positive-phase terminal of a differential amplification circuit 40N. In addition, a negative-phase terminal of the differential amplification circuit 40N is connected to a source electrode S of the N channel FET 42N, and an output terminal of the differential amplification circuit 40N is connected to a gate electrode of the N channel FET 42N. An input side resistor RdN is connected between a drain electrode ID of the N channel FET 42N and the negative input terminal T3N, and a secondary input side resistor ReN is connected between the negative input terminal T3N and the negative power supply terminal −VA. In addition, an output side resistor RfN is connected between the source electrode S of the N channel FET 42N and the negative power supply terminal −VA. The drain electrode ID of the N channel FET 42N is connected to the load terminal TL.

The circuit configuration of the negative power supply amplification portion 30N is the same as a circuit configuration obtained by replacing the transistor 10 with an FET in the pseudo-triode characteristic linear amplifier in FIG. 1. However, the part corresponding to the positive terminal of the DC voltage source 14 in the circuit configuration shown in FIG. 1 becomes the ground conductor in the circuit configuration shown in FIG. 7. Further, the positive power supply amplification portion 30P has a complementary configuration with the negative power supply amplification portion 30N. Therefore, the positive power supply amplification portion 30P and the negative power supply amplification portion 30N amplify signals sent from the driving unit 28 so as to drive the speaker 26, based on the same principle as that of the pseudo-triode characteristic linear amplifier in FIG. 1.

A bias voltage and a bias current are set such that the FETs included in the positive power supply amplification portion 30P and the negative power supply amplification portion 30N are operated as class A, class AB, or class B. The bias current is adjusted by varying currents flowing through the DC constant current sources 38 and 38N included in the driving unit 28.

The P channel FET 42 of the positive power supply amplification portion 30P allows a current depending on a variation in a current which is made to flow through the positive input terminal T3 by the positive power supply driving portion 28P, to flow through a path which is formed from the positive power supply terminal +VA to the speaker 26 via the source electrode S and the drain electrode D thereof. In a similar manner, the N channel FET 42N of the negative power supply amplification portion 30N allows a current depending on a variation in a current which is made to flow through the negative input terminal T3N by the negative power supply driving portion 28N, to flow through a path which is formed from the speaker 26 to the negative power supply terminal −VA via the drain electrode D and the source electrode S thereof. Therefore, the current which is made to flow through the speaker 26 by the positive power supply amplification portion 30P and the current which is made to flow through the speaker 26 by the negative power supply amplification portion 30N are synthesized with each other by the speaker 26. Thereby, the speaker 26 is driven by a signal which is output from the signal source 32 and amplified by the driving unit 28 and the power amplification unit 30.

In addition, there are cases where a DC potential at the load terminal TL is not 0, due to a variation in the temperature of the semiconductor element in the OTL push-pull circuit using the positive and negative DC power supplies. This phenomenon is generally called a drift. Therefore, the pseudo-triode characteristic OTL push-pull linear amplifier according to the embodiment includes a drift-stabilizing circuit 44.

The drift-stabilizing circuit 44 is connected to the positive power supply terminal +VB, the negative power supply terminal −VB, the ground conductor, the load terminal TL, and the positive input terminal T3. The drift-stabilizing circuit decreases a current Iα which flows into the drift-stabilizing circuit 44 from the positive input terminal T3 if a potential at the load terminal TL is higher than a potential at the ground conductor, and increases the current Ia which flows into the drift-stabilizing circuit 44 from the positive input terminal T3 if the potential at the load terminal TL is lower than the potential at the ground conductor. This adjusts currents flowing through the input side resistor Rd and the secondary input side resistor Re and voltage drops occurring at the resistors, and maintains the DC potential at the load terminal TL to be 0. The drift-stabilizing circuit 44 may be configured by an analog circuit using a transistor, an FET, or the like.

In addition, generally, there are cases where a bias state of a semiconductor element used in the final stage of the audio amplifier varies due to a temperature variation. Therefore, the pseudo-triode characteristic OTL push-pull linear amplifier according to the embodiment includes a bias-stabilizing circuit 46 and a current mirror circuit 50.

The bias-stabilizing circuit 46 is connected to the source electrode S of the P channel FET 42 of the negative power supply amplification portion 30N, the negative power supply terminal −VB, the current mirror circuit 50, and the ground conductor. The bias-stabilizing circuit 46 is connected to a positive terminal of a constant voltage source 48 of which a negative terminal is connected to the negative power supply terminal −VA. The constant voltage source 48 may use a zener diode. The bias stabilizing circuit 46 increases a current Iβ which flows through the current mirror circuit 50 if a potential at the source electrode S of the P channel FET 42 is higher than a potential at the constant voltage source 48, and decreases the current Iβ which flows through the current mirror circuit 50 if the potential at the source electrode S of the P channel FET 42 is lower than the potential at the constant voltage source 48. The bias-stabilizing circuit 46 may be configured by an analog circuit using a transistor, an FET, or the like.

The current mirror circuit 50 is connected to the bias-stabilizing circuit 46, the negative power supply terminal −VB, and the negative input terminal T3N. The current mirror circuit 50 incorporates a current Iγ having the same value as the current Iβ which flows from the bias-stabilizing circuit 46 and flows toward the negative power supply terminal −VB, from the negative input terminal T3N, and allows the current Iγ to flow toward the negative power supply terminal −VB.

With such a configuration, currents flowing through the input side resistor RdN and the secondary input side resistor ReN, and voltage drops occurring at the resistors are adjusted according to a voltage at the source electrode S of the P channel FET 42 of the negative power supply amplification portion 30N, and thus a voltage at the negative input terminal T3N is maintained constant. In addition, since a bias voltage at the source electrode S of the P channel FET 42 of the negative power supply amplification portion 30N is the same as a bias voltage at the negative input terminal T3N, the bias at the source electrode S is also maintained to be the same as that.

The positive power supply amplification portion 30P and the negative power supply amplification portion 30N in the pseudo-triode characteristic OTL push-pull linear amplifier according to the embodiment have the same configuration as that of the pseudo-triode characteristic linear amplifier according to the first embodiment. Therefore, it is possible to configure an amplifier having the same acoustic characteristic as that of the triode amplifier using semiconductor elements, and to reduce distortion of an output signal supplied to an acoustic load. In addition, it is possible to stabilize operations by using the drift-stabilizing circuit 44 and the bias-stabilizing circuit 46.

Figure 8:
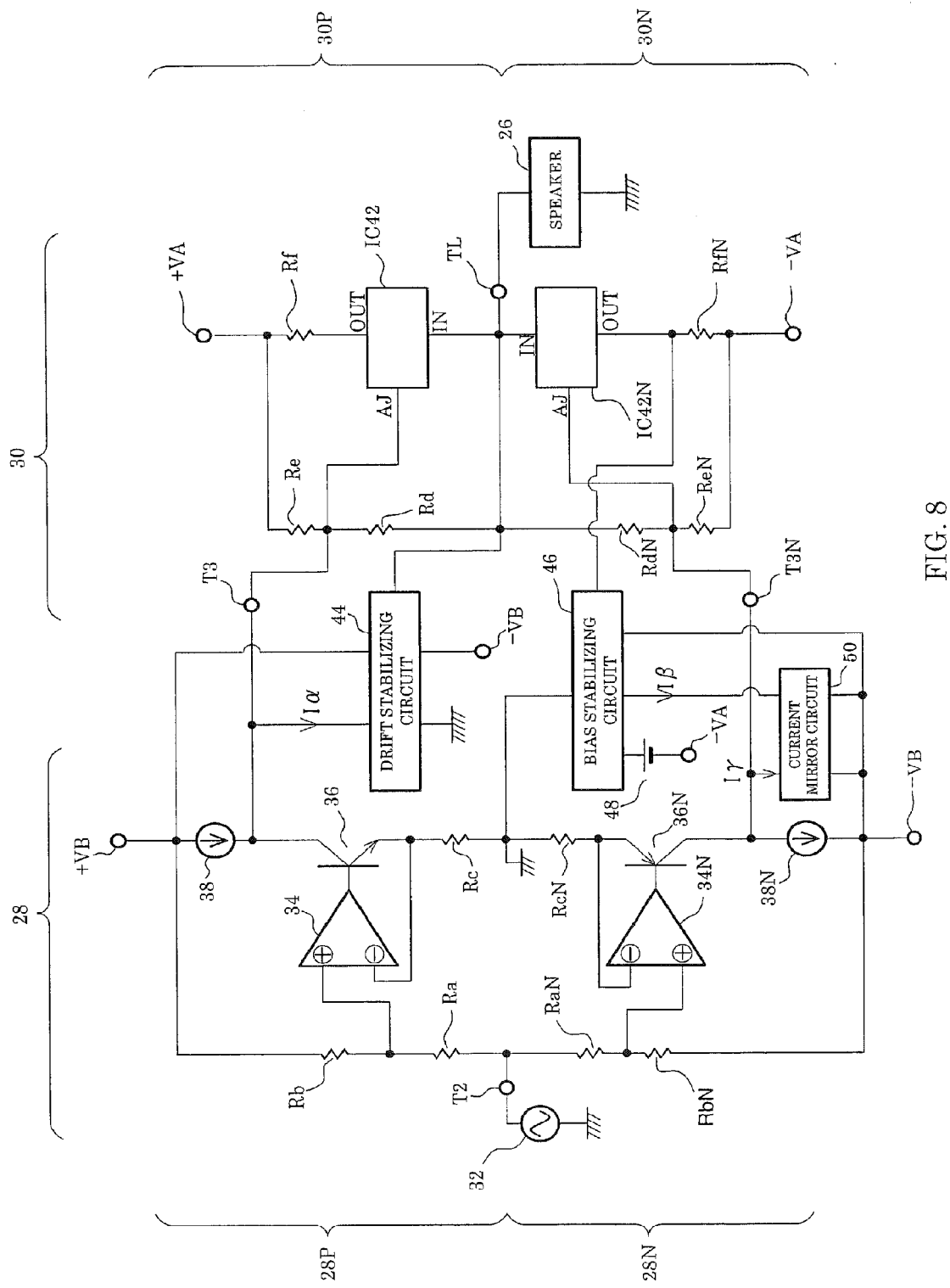
FIG. 8 is a diagram illustrating a pseudo-triode characteristic OTL push-pull linear amplifier using a regulator element.

Further, in the pseudo-triode characteristic OTL push-pull linear amplifier according to the embodiment, regulator elements IC42 and IC42N may be used as shown in FIG. 8. The regulator element IC42N has a complementary characteristic with the regulator element IC42. For example, as the regulator elements 1042 and IC42N, "LM337" and "LM317" provided by National Semiconductor Corporation are respectively used. An IN terminal of the regulator element 1042 is connected to the load terminal TL, and an OUT terminal thereof is connected to one end of the output side resistor Rf. In addition, an AJ terminal is connected to a connection point of the input side resistor Rd and the secondary input side resistor Re. In a similar manner, an IN terminal of the regulator element IC42N is connected to the load terminal TL, and an OUT terminal thereof is connected to one end of the output side resistor RfN. In addition, an AJ terminal is connected to a connection point of the input side resistor RdN and the secondary input side resistor ReN. With such a configuration, it is possible to enable an acoustic characteristic to closely approximate the characteristic of the triode amplifier, and to reduce distortion of an output signal, based on the same principle as in the circuit shown in FIG. 6.

As above, the embodiments of the invention have been described. The embodiments are only examples, and various embodiments are possible based on the spirit of the invention grasped from the claims.

What is claimed:

1. An acoustic pseudo-triode characteristic push-pull amplification device comprising:

first and second current-driving sources that respectively output signals responding to a common input signal, and have electric characteristics that are complementary with each other;

a first pseudo-triode characteristic amplification unit that receives a signal from the first current-driving source; and a second pseudo-triode characteristic amplification unit that receives a signal from the second current-driving source and has an electric characteristic complementary with that of the first pseudo-triode characteristic amplification unit, wherein each of the first and second pseudo-triode characteristic amplification units includes, a semiconductor element that has a first electrode, a second electrode, and a control electrode, where a current flowing between the first electrode and the second electrode varies depending on a signal applied to the control electrode;

an acoustic load terminal that is provided in a path drawn from the first electrode and is connected to an acoustic load which is interposed between the acoustic load terminal and a ground conductor; and a second electrode side resistor that is provided between the second electrode and a reference voltage terminal;

wherein the first pseudo-triode characteristic amplification unit comprises:

a first input terminal that leads a signal from the first current-driving source to the control electrode in the first pseudo-triode characteristic amplification unit; and an input side resistor that is provided between the first electrode and the first input terminal in the first pseudo-triode characteristic amplification unit, wherein the second pseudo-triode characteristic amplification unit comprises:

a second input terminal that leads a signal from the second current-driving source to the control electrode in the second pseudo-triode characteristic amplification unit; and an input side resistor that is provided between the first electrode and the second input terminal in the second pseudo-triode characteristic amplification unit, wherein DC voltages having different polarities are respectively applied between the reference voltage terminal of the first pseudo-triode characteristic amplification unit and the ground conductor, and between the reference voltage terminal of the second pseudo-triode characteristic amplification unit and the ground conductor, wherein the acoustic load terminal of the first pseudo-triode characteristic amplification unit and the acoustic load terminal of the second pseudo-triode characteristic amplification unit are connected in common, and a common acoustic load is connected to the first and second pseudo-triode characteristic amplification units, wherein the first current driving source has a current-driving semiconductor element that allows a current varying depending on the input signal to flow through the first input terminal with signal source impedance greater than input impedance of the first input terminal, and wherein the second current driving source has a current-driving semiconductor element that allows a current varying depending on the input signal to flow through the second input terminal with signal source impedance greater than input impedance of the second input terminal.

2. An acoustic pseudo-triode characteristic push-pull amplification device comprising:

first and second current-driving sources that respectively output signals responding to a common input signal, and have electric characteristics that are complementary with each other;

a first pseudo-triode characteristic amplification unit that receives a signal from the first current-driving source; and a second pseudo-triode characteristic amplification unit that receives a signal from the second current-driving source and has an electric characteristic complementary with that of the first pseudo-triode characteristic amplification unit, wherein each of the first and second pseudo-triode characteristic amplification units includes, a semiconductor element that has a first electrode, a second electrode, and a control electrode, where a current flowing between the first electrode and the second electrode varies depending on a signal applied to the control electrode;

an input terminal that leads an applied signal to the control electrode;

an acoustic load terminal that is provided in a path drawn from the first electrode and is connected to an acoustic load which is interposed between the acoustic load terminal and a ground conductor;

a second electrode side resistor that is provided between the second electrode and a reference voltage terminal;

an input side resistor that is provided between the first electrode and the input terminal, a current mirror circuit that is connected to the input terminal of the second pseudo-triode characteristic amplification unit; and a bias-stabilizing circuit that is connected to a connection path of the second electrode and the second electrode side resistor of the second pseudo-triode characteristic amplification unit and the current mirror circuit, and allows a current varying according to a potential at the connection path and a reference potential to flow through the current mirror circuit, wherein DC voltages having different polarities are respectively applied between the reference voltage terminal of the first pseudo-triode characteristic amplification unit and the ground conductor, and between the reference voltage terminal of the second pseudo-triode characteristic amplification unit and the ground conductor, wherein the acoustic load terminal of the first pseudo-triode characteristic amplification unit and the acoustic load terminal of the second pseudo-triode characteristic amplification unit are connected in common, and a common acoustic load is connected to the first and second pseudo-triode characteristic amplification units, wherein the first current driving source has a current-driving semiconductor element that allows a current varying depending on the input signal to flow through the corresponding input terminal with signal source impedance greater than input impedance of the input terminal of the first pseudo-triode characteristic amplification unit, wherein the second current driving source has a current-driving semiconductor element that allows a current varying depending on the input signal to flow through the corresponding input terminal with signal source impedance greater than input impedance of the input terminal of the second pseudo-triode characteristic amplification unit, and wherein the current mirror circuit allows a current varying according to a current flowing from the bias-stabilizing circuit to flow through a path which is formed from the input terminal of the second pseudo-triode characteristic amplification unit to the current mirror circuit.

3. An acoustic pseudo-triode characteristic push-pull amplification device comprising:

first and second current-driving sources that respectively output signals responding to a common input signal, and have electric characteristics that are complementary with each other;

a first pseudo-triode characteristic amplification unit that receives a signal from the first current-driving source; and a second pseudo-triode characteristic amplification unit that receives a signal from the second current-driving source and has an electric characteristic complementary with that of the first pseudo-triode characteristic amplification unit, wherein each of the first and second pseudo-triode characteristic amplification units includes, a semiconductor element that has a first electrode, a second electrode, and a control electrode, where a current flowing between the first electrode and the second electrode varies depending on a signal applied to the control electrode;

an input terminal that leads an applied signal to the control electrode;

an acoustic load terminal that is provided in a path drawn from the first electrode and is connected to an acoustic load which is interposed between the acoustic load terminal and a ground conductor;

a second electrode side resistor that is provided between the second electrode and a reference voltage terminal;

an input side resistor that is provided between the first electrode and the input terminal, and a drift-stabilizing circuit that is connected to the input terminal of the first pseudo-triode characteristic amplification unit and the acoustic load terminal, wherein DC voltages having different polarities are respectively applied between the reference voltage terminal of the first pseudo-triode characteristic amplification unit and the ground conductor, and between the reference voltage terminal of the second pseudo-triode characteristic amplification unit and the ground conductor, wherein the acoustic load terminal of the first pseudo-triode characteristic amplification unit and the acoustic load terminal of the second pseudo-triode characteristic amplification unit are connected in common, and a common acoustic load is connected to the first and second pseudo-triode characteristic amplification units, wherein the first current driving source has a current-driving semiconductor element that allows a current varying depending on the input signal to flow through the corresponding input terminal with signal source impedance greater than input impedance of the input terminal of the first pseudo-triode characteristic amplification unit, wherein the second current driving source has a current-driving semiconductor element that allows a current varying depending on the input signal to flow through the corresponding input terminal with signal source impedance greater than input impedance of the input terminal of the second pseudo-triode characteristic amplification unit, and wherein the drift-stabilizing circuit allows a current varying according to a potential at the acoustic load terminal and a ground potential to flow through a path which is formed from the input terminal of the first pseudo-triode characteristic amplification unit to the drift-stabilizing circuit.

4. An acoustic pseudo-triode characteristic push-pull amplification device comprising:

first and second current-driving sources that respectively output signals responding to a common input signal, and have electric characteristics that are complementary with each other;

a first pseudo-triode characteristic amplification unit that receives a signal from the first current-driving source; and a second pseudo-triode characteristic amplification unit that receives a signal from the second current-driving source and has an electric characteristic complementary with that of the first pseudo-triode characteristic amplification unit, wherein each of the first and second pseudo-triode characteristic amplification units includes, a semiconductor element that has a first electrode, a second electrode, and a control electrode, where a current flowing between the first electrode and the second electrode varies depending on a signal applied to the control electrode;

an input terminal that leads an applied signal to the control electrode;

an acoustic load terminal that is provided in a path drawn from the first electrode and is connected to an acoustic load which is interposed between the acoustic load terminal and a ground conductor;

a second electrode side resistor that is provided between the second electrode and a reference voltage terminal; and an input side resistor that is provided between the first electrode and the input terminal, wherein DC voltages having different polarities are respectively applied between the reference voltage terminal of the first pseudo-triode characteristic amplification unit and the ground conductor, and between the reference voltage terminal of the second pseudo-triode characteristic amplification unit and the ground conductor, wherein the acoustic load terminal of the first pseudo-triode characteristic amplification unit and the acoustic load terminal of the second pseudo-triode characteristic amplification unit are connected in common, and a common acoustic load is connected to the first and second pseudo-triode characteristic amplification units, wherein the first current driving source has a current-driving semiconductor element that allows a current varying depending on the input signal to flow through the corresponding input terminal with signal source impedance greater than input impedance of the input terminal of the first pseudo-triode characteristic amplification unit, wherein the second current driving source has a current-driving semiconductor element that allows a current varying depending on the input signal to flow through the corresponding input terminal with signal source impedance greater than input impedance of the input terminal of the second pseudo-triode characteristic amplification unit, wherein each of the first and second pseudo-triode characteristic amplification units includes a voltage-holding circuit that maintains a relationship between a voltage at the input terminal and a voltage at the second electrode to be constant, and outputs a voltage according to the voltage at the input terminal to the control electrode, and wherein the voltage-holding circuit is a differential amplification circuit which has a first terminal connected to the input terminal, a second terminal connected to the second electrode, and a third terminal connected to the control electrode, has the first and second terminals as a pair of differential input terminals, and has the third terminal as an output terminal.

5. The acoustic pseudo-triode characteristic push-pull amplification device according to claim 1, wherein the first pseudo-triode characteristic amplification unit includes a secondary input side resistor that is provided between the first input terminal and the reference voltage terminal of the first pseudo-triode characteristic amplification unit, and the second pseudo-triode characteristic amplification unit includes a secondary input side resistor that is provided between the second input terminal and the reference voltage terminal of the second pseudo-triode characteristic amplification unit.

6. An acoustic pseudo-triode characteristic amplification device comprising:

a semiconductor element that has a first electrode, a second electrode, and a control electrode, where a current flowing between the first electrode and the second electrode varies depending on a signal applied to the control electrode;

an input terminal that leads a signal applied from a current-driving source to the control electrode;

an acoustic load terminal that is provided in a path drawn from the first electrode and is connected to an acoustic load which is interposed between the acoustic load terminal and the other end of a DC voltage source of which one end is connected to a ground conductor;

a second electrode side resistor that is provided between the second electrode and the ground conductor;

an input side resistor that is provided between the first electrode and the input terminal; and a voltage-holding circuit that maintains a relationship between a voltage at the input terminal and a voltage at the second electrode to be constant, and outputs a voltage according to the voltage at the input terminal to the control electrode, wherein the current-driving source allows a current to flow through the input terminal as an acoustic signal with signal source impedance greater than input impedance of the input terminal, and wherein the voltage-holding circuit is a differential amplification circuit which has a first terminal connected to the input terminal, a second terminal connected to the second electrode, and a third terminal connected to the control electrode, has the first and second terminals as a pair of differential input terminals, and has the third terminal as an output terminal.

7. The acoustic pseudo-triode characteristic amplification device according to claim 6, further comprising a secondary input side resistor that is provided between the input terminal and the reference voltage terminal.

* * * * *